(12) United States Patent
Smith et al.

(10) Patent No.: US 11,891,157 B2
(45) Date of Patent: Feb. 6, 2024

(54) GYROSCOPIC BOAT ROLL STABILIZER

(71) Applicant: WaveTamer LLC, Greenville, NC (US)

(72) Inventors: Grady F. Smith, Greenville, NC (US); David Holden, Davidson, NC (US); Jeffrey Peterson, Mooresville, NC (US)

(73) Assignee: WAVETAMER LLC, Greenville, NC (US)

( * ) Notice: Subject to any disclaimer, the term of this patent is extended or adjusted under 35 U.S.C. 154(b) by 0 days.

(21) Appl. No.: 18/128,834

(22) Filed: Mar. 30, 2023

(65) Prior Publication Data

US 2023/0234684 A1 Jul. 27, 2023

Related U.S. Application Data

(63) Continuation of application No. 16/428,259, filed on May 31, 2019, now Pat. No. 11,649,017.
(Continued)

(51) Int. Cl.
*B63B 39/04* (2006.01)
*F16F 15/30* (2006.01)
(Continued)

(52) U.S. Cl.
CPC .......... *B63B 39/04* (2013.01); *F16F 15/3153* (2013.01); *F16F 15/3156* (2013.01);
(Continued)

(58) Field of Classification Search
CPC .......... B63B 39/04; H02K 7/02; H02K 9/227; F16F 15/3153; F16F 15/3156;
(Continued)

(56) References Cited

U.S. PATENT DOCUMENTS 1,655,800 A * 1/1928 Schein .................... B63B 39/04
74/5.37
2,795,142 A 6/1957 Smith
(Continued)

FOREIGN PATENT DOCUMENTS

| BR | PI0707129-9 B1 | 7/2018 |
|---|---|---|
| CN | 1484739 A | 3/2004 |

(Continued)

*Primary Examiner* — Adam D Rogers
(74) *Attorney, Agent, or Firm* — COATS & BENNETT, PLLC

(57) ABSTRACT

A gyroscopic roll stabilizer comprises a gimbal having a support frame and enclosure configured to maintain a below-ambient pressure, a flywheel assembly including a flywheel and flywheel shaft, one or more bearings for rotatably mounting the flywheel inside the enclosure, a motor for rotating the flywheel, and bearing cooling system for cooling the bearings supporting the flywheel. For smaller units, the bearing cooling system is effective to enable a flywheel with a moment of inertia less than 40,000 lb in$^2$ to be accelerated at a rate of 5 rpm/s or greater. For larger units, the bearing cooling system is effective to enable a flywheel with a moment of inertia greater than 40,000 lb in$^2$ to be accelerated at a rate of 2.5 rpm/s or greater.

20 Claims, 11 Drawing Sheets

Related U.S. Application Data

(60) Provisional application No. 62/768,356, filed on Nov. 16, 2018, provisional application No. 62/678,422, filed on May 31, 2018.

(51) Int. Cl.
    *H02K 7/02* (2006.01)
    *H02K 9/22* (2006.01)
    *G05D 1/08* (2006.01)
    *G01C 21/18* (2006.01)
    *F16C 37/00* (2006.01)
    *F16F 15/315* (2006.01)
    *H05K 7/20* (2006.01)
    *F16C 19/52* (2006.01)

(52) U.S. Cl.
    CPC .............. *H02K 7/02* (2013.01); *H02K 9/227* (2021.01); *F16C 19/525* (2013.01); *F16C 37/007* (2013.01); *F16F 2222/025* (2013.01); *G01C 21/18* (2013.01); *G05D 1/0875* (2013.01); *H05K 7/20854* (2013.01); *H05K 7/20872* (2013.01); *Y10T 74/12* (2015.01)

(58) Field of Classification Search
    CPC .. F16F 2222/025; Y10T 74/12; F16C 19/525; F16C 37/007; G01C 21/18; G05D 1/0875; H05K 7/20854; H05K 7/20872
    See application file for complete search history.

(56) References Cited

U.S. PATENT DOCUMENTS

| | | | |
|---|---|---|---|
| 3,051,533 A | 8/1962 | Brass | |
| 3,260,872 A | 7/1966 | Potter | |
| 3,844,341 A | 10/1974 | Bimshas, Jr. et al. | |
| 4,165,472 A | 8/1979 | Wittry | |
| 4,304,296 A | 12/1981 | Shaffer | |
| 4,602,874 A | 7/1986 | Neugebauer | |
| H312 H | 7/1987 | Parker | |
| 5,054,583 A | 10/1991 | Wrzyszczynski | |
| 5,207,408 A | 5/1993 | Burg | |
| 6,144,128 A | 11/2000 | Rosen | |
| 6,175,172 B1 | 1/2001 | Bakholdin et al. | |
| 6,373,394 B1 | 4/2002 | Zhang | |
| 6,566,775 B1 | 5/2003 | Fradella | |
| 6,913,390 B2 | 7/2005 | Inoue et al. | |
| 6,959,756 B2 | 11/2005 | Woodard et al. | |
| 6,973,847 B2 | 12/2005 | Adams et al. | |
| 7,458,329 B2 | 12/2008 | Nedwed | |
| 7,546,782 B2 | 6/2009 | Adams et al. | |
| 8,117,930 B2 | 2/2012 | Adams et al. | |
| 8,899,166 B2 | 12/2014 | Steinmann et al. | |
| 10,794,699 B2 | 10/2020 | Miocevich et al. | |
| 10,989,534 B2 | 4/2021 | Miocevich et al. | |
| 11,427,289 B2 | 8/2022 | Smith et al. | |
| 11,428,530 B2 | 8/2022 | Salutari | |
| 11,440,629 B2 | 9/2022 | Peterson | |
| 11,591,052 B2* | 2/2023 | Sohacki ................ G01C 19/20 |
| 11,628,914 B2* | 4/2023 | Peterson ................ G01C 19/28 74/5.22 |
| 11,649,017 B2* | 5/2023 | Smith .................... H02K 7/083 74/5.22 |
| 11,698,255 B2* | 7/2023 | Salutari ................. G01C 19/16 74/5 R |
| 2003/0100376 A1 | 5/2003 | Friedmann et al. | |
| 2003/0184176 A1 | 10/2003 | Steinmeyer | |
| 2003/0221626 A1 | 12/2003 | Leavitt et al. | |
| 2004/0080218 A1 | 4/2004 | Weidman et al. | |
| 2004/0164495 A1 | 8/2004 | Oldenburg | |
| 2004/0244513 A1 | 12/2004 | Adams et al. | |
| 2005/0040776 A1 | 2/2005 | Sibley | |
| 2007/0157749 A1 | 7/2007 | Adams et al. | |
| 2008/0303363 A1 | 12/2008 | Alston | |
| 2009/0301373 A1 | 12/2009 | Adams et al. | |
| 2010/0109341 A1 | 5/2010 | Fullerton | |
| 2010/0320333 A1 | 12/2010 | Martin | |
| 2011/0209568 A1 | 9/2011 | Anderson | |
| 2013/0036959 A1 | 2/2013 | Steinmann et al. | |
| 2014/0245939 A1 | 9/2014 | Nohara et al. | |
| 2017/0009845 A1 | 1/2017 | Arseneaux et al. | |
| 2018/0034344 A1 | 2/2018 | Hitchcock et al. | |
| 2018/0051988 A1 | 2/2018 | Miocevich et al. | |
| 2018/0269743 A1 | 9/2018 | Buttner et al. | |
| 2019/0367137 A1 | 12/2019 | Smith et al. | |
| 2019/0367138 A1 | 12/2019 | Smith et al. | |
| 2020/0317308 A1* | 10/2020 | Peterson ................ B63B 39/04 |
| 2020/0400432 A1 | 12/2020 | Miocevich et al. | |
| 2021/0171165 A1 | 6/2021 | Skaun | |
| 2021/0231437 A1 | 7/2021 | Salutari | |
| 2021/0269127 A1 | 9/2021 | Sohacki et al. | |
| 2022/0371703 A1* | 11/2022 | Smith .................... B63B 39/04 |
| 2023/0166818 A1* | 6/2023 | Sohacki .................... B63J 3/04 114/121 |
| 2023/0211858 A1* | 7/2023 | Sohacki ................. H02K 5/203 114/122 |
| 2023/0227131 A1* | 7/2023 | Sohacki ............. G01C 21/3602 114/122 |
| 2023/0234681 A1* | 7/2023 | Peterson ................ G01C 19/28 74/5.22 |
| 2023/0234682 A1* | 7/2023 | Peterson ................ G01C 19/28 74/5.22 |
| 2023/0234683 A1* | 7/2023 | Smith .................... H02K 9/227 74/5.22 |
| 2023/0273023 A1* | 8/2023 | Siefert ................... G01C 19/04 702/104 |

FOREIGN PATENT DOCUMENTS

| | | | | |
|---|---|---|---|---|
| CN | 101443987 A | 5/2009 | | |
| CN | 102810943 A | 12/2012 | | |
| CN | 104578595 A | 4/2015 | | |
| CN | 204408103 U | 6/2015 | | |
| CN | 105292395 A | 2/2016 | | |
| CN | 107757838 A | 3/2018 | | |
| CN | 207064483 U | 3/2018 | | |
| CN | 109693762 A | * 4/2019 | ............ B63B 39/04 |
| CN | 110131319 A | 8/2019 | | |
| DE | 19909491 A1 | 9/2000 | | |
| EP | 0458499 B1 | 7/1997 | | |
| EP | 2361833 A2 | 8/2011 | | |
| EP | 3339804 A1 | 6/2018 | | |
| FR | 1432057 A | 3/1966 | | |
| JP | H09144806 A | 6/1997 | | |
| JP | H09506310 A | 6/1997 | | |
| JP | H09263293 A | 10/1997 | | |
| JP | 2005503097 A | 1/2005 | | |
| JP | 2018028542 A | 2/2018 | | |
| WO | 9513647 A1 | 5/1995 | | |
| WO | 0202943 A1 | 1/2002 | | |
| WO | 03023942 A1 | 3/2003 | | |
| WO | 2009049371 A1 | 4/2009 | | |
| WO | 2014019322 A1 | 2/2014 | | |
| WO | 2016050534 A1 | 4/2016 | | |
| WO | 2019224322 A1 | 11/2019 | | |
| WO | 2019232371 A1 | 12/2019 | | |
| WO | 2022046508 A1 | 3/2022 | | |

\* cited by examiner

GYROSCOPIC BOAT ROLL STABILIZER

RELATED APPLICATIONS

This application is a continuation of application Ser. No. 16/428,259, filed on May 31, 2019, which claims priority to U.S. Provisional Patent Application Ser. No. 62/678,422, filed May 31, 2018, and U.S. Provisional Patent Application Ser. No. 62/768,356, filed Nov. 16, 2018, the disclosures of which are incorporated by reference herein in their entirety.

TECHNICAL FIELD

The present disclosure relates generally to boat roll stabilizers for reducing the sideways rolling motion of a boat and, more particularly, to controlled moment gyroscopes for reducing the roll of a boat based on the gyroscopic effect.

BACKGROUND

The sideways rolling motion of a boat can create safety problems for passengers and crew on boats, as well as cause discomfort to passengers not accustomed to the rolling motion of the boat. A number of technologies currently exist to reduce the sideways rolling motion of a boat. One technology currently in use is active fin stabilization. Stabilizer fins are attached to the hull of the boat beneath the waterline and generate lift to reduce the roll of the boat due to wind or waves. In the case of active fin stabilization, the motion of the boat is sensed and the angle of the fin is controlled based on the motion of the boat to generate a force to counteract the roll. Fin stabilization is most commonly used on large boats and are effective when the boat is underway. Fin stabilization technology is not used frequently in smaller boats and is generally not effective when the boat is at rest. Stabilizer fins also add to the drag of the hull and are susceptible to damage.

Gyroscopic boat stabilization is another technology for roll suppression that is based on the gyroscopic effect. A control moment gyroscope (CMG) is mounted in the boat and generates a torque that can be used to counteract the rolling motion of the boat. The CMG includes a flywheel that spins at a high speed. A controller senses the attitude of the boat and uses the energy stored in the flywheel to "correct" the attitude of the boat by applying a torque to the hull counteracting the rolling motion of the boat. CMGs work not only when a boat is underway, but also when the boat is at rest. CMGs are also less expensive than stabilizer fins, do not add to the drag of the hull, and are not exposed to risk of damage.

Although, CMGs are gaining in popularity, particularly for smaller fishing boats and yachts, this technology has some limitations. The energy used to counteract the rolling motion of the boat comes from the rotation of the flywheel at a high rate of speed. Consequently, heat builds up in the bearings supporting the flywheel and bearing failure can result, which presents an extreme hazard for the boat due to the amount of energy stored in the flywheel. In order to obtain the high spin rate, the flywheel is typically contained in a vacuum enclosure, which makes heat dissipation problematic.

Another problem with existing CMGs is that it takes a significant amount of time for the flywheel to "spin up," i.e., to obtain its desired operating speed. In some CMGs currently on the market, it can take as long as 70 minutes before the CMG is ready for use. The long "spin up" period means that the CMG cannot be used for trips of short duration, which comprises a majority of boating occasions. It also takes a long time for the flywheel to "spin down," typically in the order of several hours. While the flywheel is spinning down, it continues to make a whining noise, which can be disruptive to the enjoyment of the occupants after the boat has arrived at its destination on the water or returned to the docks following a day of boating.

SUMMARY

The present disclosure relates to a gyroscopic roll stabilizer for a boat. The gyroscopic roll stabilizer includes an enclosure mounted to a gimbal and configured to maintain a below-ambient pressure, a flywheel assembly including a flywheel and flywheel shaft, one or more bearings for rotatably mounting the flywheel assembly inside the enclosure, a motor for rotating the flywheel, and a bearing cooling system for cooling the bearings supporting the flywheel. In one embodiment, the bearing cooling system comprises a heat sink that is disposed within a cavity formed within the end of the flywheel shaft. Heat is transferred from the flywheel shaft to the heat sink and then by solid and/or liquid conduction to the heat exchanger. In another embodiment, cooling is achieved by delivering a liquid coolant into a tapered cavity in the end of the flywheel shaft. The cavity is shaped so that the centrifugal force causes the liquid coolant to flow towards the open end of the shaft, where the liquid coolant is collected by a fluid collection system.

One aspect of the disclosure comprises methods of operating a CMG configured to function as a roll stabilizer for a boat. In one embodiment of the method, a below ambient pressure is maintained within a vacuum enclosure surrounding a flywheel assembly and the flywheel assembly is accelerated at an acceleration rate of at least 5 rpm/s. The flywheel assembly includes a flywheel shaft supported by bearings. The method further comprises dissipating heat from bearings supporting the flywheel shaft by transferring heat by conduction through the flywheel shaft to the exterior of the enclosure.

In another embodiment of the method, a below ambient pressure is maintained within a vacuum enclosure surrounding a flywheel assembly having a moment of inertia of at least 40000 lb-in$^2$. The flywheel assembly includes a flywheel shaft supported by bearings. The method further comprises applying power to the flywheel assembly to accelerate the flywheel assembly at an acceleration rate of at least 2.5 rpm/s and dissipating heat from the bearings supporting the flywheel shaft by transferring heat from the flywheel shaft to a heat transfer material disposed in a cavity in the flywheel shaft.

Another aspect of the disclosure comprises a gyroscopic roll stabilizer for a boat. In one embodiment, the gyroscopic boat roll stabilizer comprises an enclosure mounted to a gimbal for rotation about a gimbal axis and configured to maintain a below-ambient pressure, a flywheel assembly including a flywheel and flywheel shaft, one or more bearings for rotatably mounting the flywheel assembly inside the enclosure, a motor for rotating the flywheel assembly and configured to accelerate the flywheel assembly at an acceleration rate of at least 5 rpm/s, and a bearing cooling system effective to cool the bearings at the acceleration rate.

In another embodiment, the gyroscopic boat roll stabilizer comprises an enclosure mounted to a gimbal for rotation about a gimbal axis and configured to maintain a below-ambient pressure, a flywheel assembly including a flywheel and flywheel shaft. The flywheel assembly has a moment of inertia greater than 11.7 kg·m$^2$ (40000 lbm in$^2$). The gyroscopic boat roll stabilizer further comprises one or more bearings for rotatably mounting the flywheel assembly inside the enclosure, a motor for rotating the flywheel assembly and configured to accelerate the flywheel assembly at an acceleration rate of at least 2.5 rpm/s, and a bearing cooling system effective to cool the bearings at the acceleration rate.

DETAILED DESCRIPTION

Figure 1A:
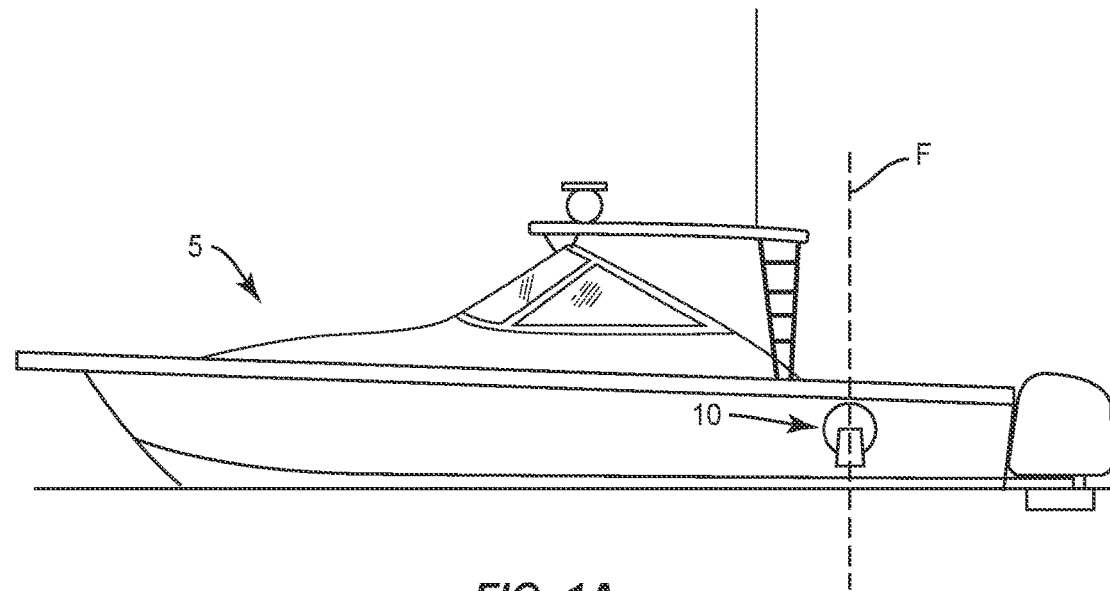
FIGS. 1A and 1B illustrate a boat equipped with a CMG as herein described.
Figure 1B:
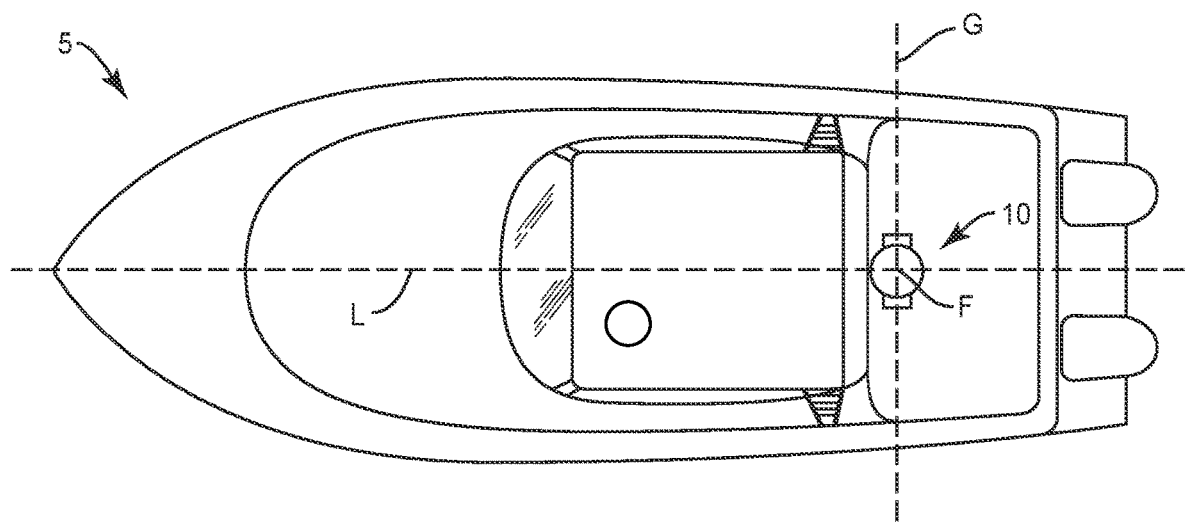

Referring now to the drawings, FIGS. 1A and 1B illustrate a CMG 10 mounted in a boat 5 for roll stabilization. Multiple embodiments of the CMG 10 are described. For convenience, similar reference numbers are used in the following description of the embodiments to indicate similar elements in each of the embodiments.

Figure 2:
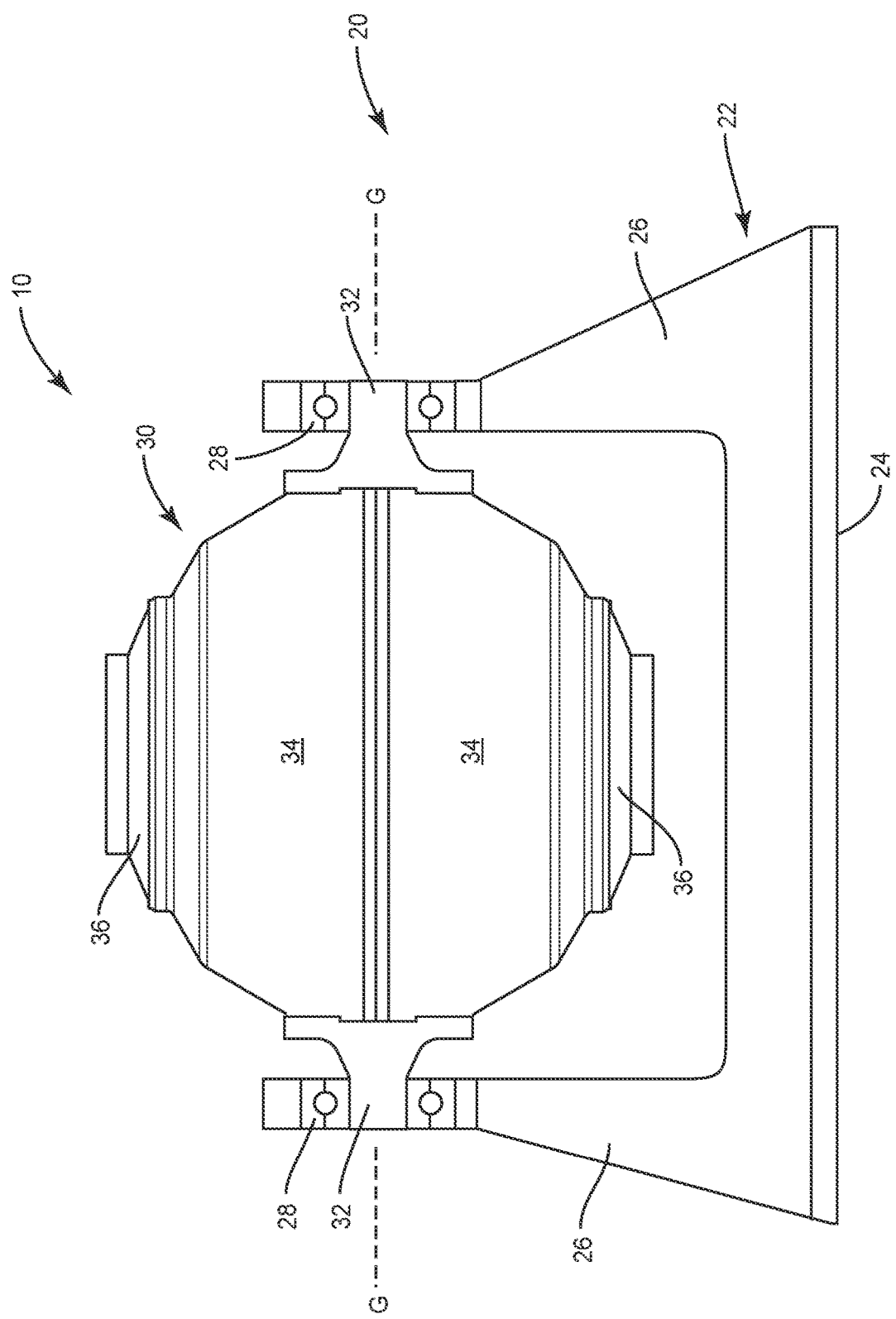
FIG. 2 is an elevation view of a CMG configured as a boat roll stabilizer according to a first embodiment.
Figure 3:
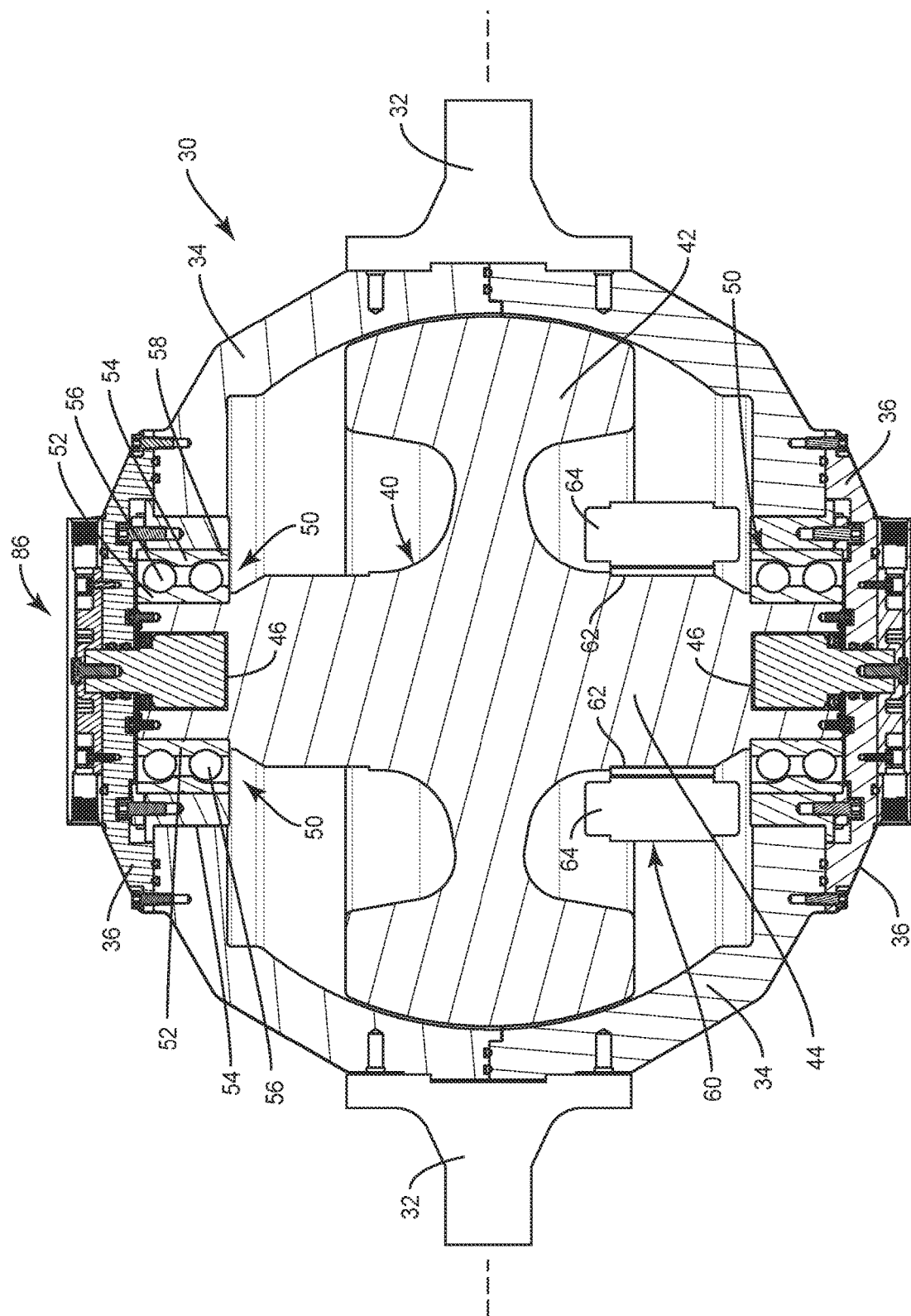
FIG. 3 is a section view through the enclosure of the CMG according to a first embodiment.

Referring now to FIGS. 2 and 3, the main functional elements of the CMG 10 comprise a single-axis gimbal 20, an enclosure 30 mounted to the gimbal 20 for rotation about a gimbal axis G, a flywheel assembly 40 mounted by bearings 50 inside the enclosure, a motor 60 to rotate the flywheel assembly 40, and a torque control system 70 (FIG. 5) to control precession of the flywheel assembly 40 so that the energy of the flywheel assembly 40 is transferred to the hull of the boat 5 to counteract rolling motions. Each of the embodiments further comprises a bearing cooling system 100 to cool the flywheel bearings 46. Various designs of the bearing cooling system 100 are shown in FIGS. 4 and 7-12.

The gimbal 20 comprises a support frame 22 that is configured to be securely mounted in the boat 5. Preferably, the gimbal 20 is mounted along a longitudinal axis L of the boat 5 with the gimbal axis G extending transverse to the longitudinal axis L. Conventionally, the gimbal 20 is mounted in the hull of the boat 5, but could be mounted at any location. The support frame 22 of the gimbal 20 comprises a base 24 and two spaced-apart supports 26. A bearing 28 is mounted on each support 26 for rotatably mounting the enclosure 30 to the supports 26. For this purpose, the enclosure 30 includes two gimbal shafts 32 projecting from diametrically opposed sides of the enclosure 30. The gimbal shafts 32 are rotatably journaled in the gimbal bearings 28 to allow the enclosure 30 and flywheel assembly 40 to rotate or process about the gimbal axis G in the fore and aft directions.

The basic elements of enclosure 30 are the same in the various embodiments described herein but vary in some details depending on the design of the bearing cooling system 100. The enclosure 30 is generally spherical in form and comprises two main housing sections 34 and two cover plates 36. The two main housing sections 34 join along a plane that bisects the spherical enclosure 30. The cover plates 36 join the main housing sections 34 along respective planes closer to the "poles" of the spherical enclosure 30. All joints in the enclosure 30 are sealed to maintain a below-ambient pressure within the enclosure 30 to reduce aerodynamic drag on the flywheel assembly 40. Although the construction of the enclosure 30 is generally the same in the embodiments herein described, the details of the housing sections 34 and cover plates 35 vary as described more fully below depending on the design of the bearing cooling system used.

Referring to FIG. 3, the flywheel assembly 40 comprises a flywheel 42 and flywheel shaft 44 that is mounted for rotation inside the enclosure 30 of the gimbal 20 so that the axis of rotation F of the flywheel assembly 40 is perpendicular to the gimbal axis G. Thus, when the boat 5 is level, the axis of the flywheel shaft 44 will be in the vertical direction, i.e. perpendicular to the deck of the boat. The flywheel 42 and shaft 44 may be formed as a unitary piece, or may comprise two separate components. In one exemplary embodiment, the diameter and the flywheel 42 is approximately 20.5 inches and the flywheel assembly 40 has a total weight of about 279 kg (614 lbs). The flywheel assembly 40 has a moment of inertia of about 9.44 kg·m$^2$ (32,273 lbm in$^2$). When rotated at a rate of 9000 rpm, the angular momentum of the flywheel assembly 40 is about 8896 kg·m$^2$/s (211,225 lbm ft$^2$).

The flywheel assembly 40 is supported by upper and lower bearing assemblies inside the enclosure 30. Each bearing assembly comprises a bearing 50 mounted within a bearing block 58. Each bearing 50 comprises an inner race 52 that contacts and rotates with the flywheel shaft 44, an outer race 54 that is mounted inside the bearing block 58, and a ball 56 disposed between the inner and outer races 52, 54. The bearing blocks 58 are secured to the interior of the enclosure. Seals (not shown) are disposed on the top and bottom of the bearings 50 to contain lubricant in the bearings 50.

The motor 60 rotates the flywheel assembly 40 at a high rate of speed (e.g., 9000 rpm). The motor 60 includes a rotor 62 that connects to the flywheel shaft 44 and a stator 64 that this secured to the enclosure 30 by any suitable mounting system. Although the motor 60 is shown mounted inside the enclosure 30, it is also possible to mount the motor 60 on the exterior of the enclosure 30. In one embodiment, the motor 60 operates on 230 Volt single phase AC power and is able to accelerate a flywheel assembly with a moment of inertia of about 9.44 kg·m$^2$ (32,273 lbm in$^2$) flywheel from rest to a rotational speed of 9000 rpm preferably in about 30 minutes or less for an average acceleration of about 5 rpm/s, and more preferably in about 20 minutes or less for an average acceleration of about 7.75 rpm/s, and even more preferably in about 10 minutes or less for an average acceleration of about 15 rpm/s (or 1.57 radians/s$^2$).

Figure 5:
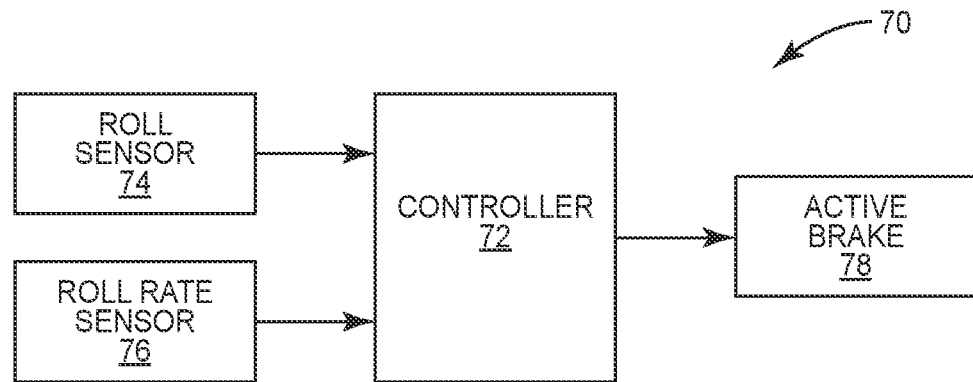
FIG. 5 illustrates a cooling circuit for a CMG.

The torque control system 70, shown in FIG. 5, controls the rate of precession of the flywheel assembly 40 about the gimbal axis G. The rolling motion of a boat 5 caused by wave action can be characterized by a roll angle and roll rate.

The rolling motion causes the flywheel 42 to process about the gimbal axis G. Sensors 74, 76 measure the roll angle and roll rate respectively, which are fed to a controller 72. The controller 102 generates control signals to control an active braking system or other torque applying device 78 that controls the rate of precession of the flywheel assembly 40. By controlling the rate of precession, the flywheel assembly 40 generates a torque in opposition to the rolling motion. This torque is transferred through the gimbal 20 to the boat 5 to dampen the roll of the boat 5. An example of the active braking system 78 is described in U.S. Provisional Application 62/828,845 filed Apr. 3, 2019 titled, "Braking System For Gyroscopic Boat Roll Stabilizer", which is incorporated herein its entirety by reference.

When the flywheel assembly 40 rotates at high speed, the bearings 50 and motor 60 will generate a substantial amount of heat, which could lead to dangerous bearing failure. Conventional air and liquid cooling techniques are not suitable for bearings 50 or other heat generating components contained within a vacuum environment. Various embodiments of the bearing cooling system 100 are disclosed herein allow cooling of bearings 50 and other heat generating components contained within the enclosure without direct contact of the oil or liquid coolant with the bearings 50 or other heat generating components, which would result in high frictional losses. In general, heat is transferred by solid and/or liquid conduction to a heat sink that is cooled by oil, glycol or other liquid coolant. Oil or liquid cooling enables more heat to be dissipated compared to air cooling or gaseous convection and conduction. Reliance on gaseous convection and conduction in existing CMGs imposes severe limitations on the amount of heat that can be dissipated because the interior of the enclosure 30 is typically maintained at a below ambient pressure. The limited heat transfer capacity in prior art CMGs 10 imposes severe limitations on the size of the electric motor that is used, which in turn limits the time to engage and use the CMG 10. Because the electric motor in conventional CMGs is undersized to avoid heat generation, conventional CMGs require significant time to accelerate the flywheel assembly 40 to a speed that provides the desired counter-torque and roll stabilization. Providing more efficient cooling of the bearings 50 as herein described enables use of a larger and more powerful motor 60 and faster acceleration of the flywheel assembly 40 so that the benefits of using the CMG 10 can be obtained in significantly shorter time periods.

Figure 6:
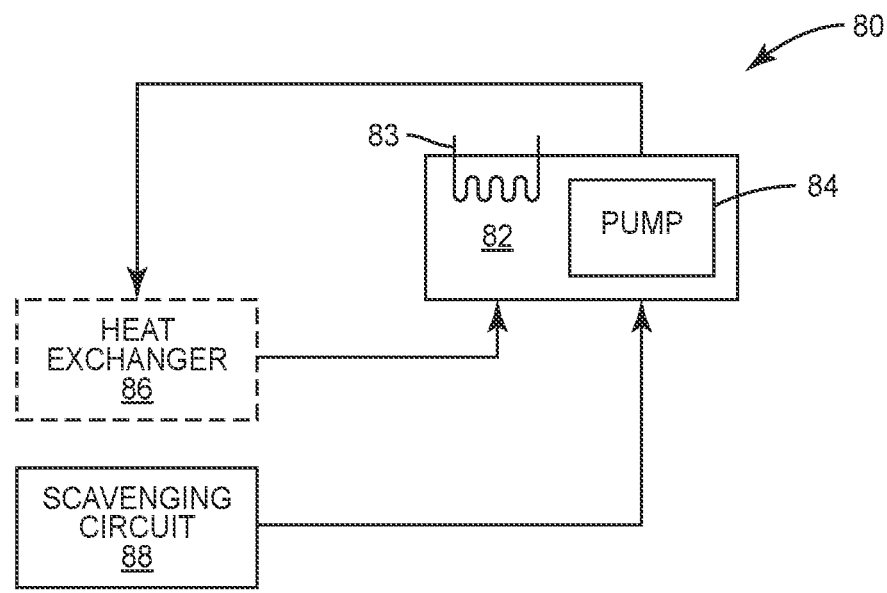
FIG. 6 illustrates a torque control system for the CMG.

FIG. 6 is a schematic diagram of a cooling circuit 80 for circulating the liquid coolant. A fluid reservoir 82 contains the liquid coolant which is circulated in a "closed" circuit by a fluid pump 84. The fluid reservoir 82 may include a heat exchanger 83 to cool the liquid coolant in the fluid reservoir 82. After collecting heat dissipated by the bearings 50, the liquid coolant passes through the heat exchanger 86 where it adsorbs and carries away heat generated by the bearings 50 as described more fully below. In some embodiments, heat is transferred from the flywheel shaft 44 to a heat sink and then by solid and liquid conduction to the heat exchanger 86. In other embodiments, heat is transferred from the flywheel shaft 44 to the liquid coolant which is circulated through a cavity 46 in the flywheel shaft 44. In this embodiment, the heat transfer to the liquid coolant occurs within the cavity 46 of the flywheel shaft 44 so the heat exchanger 86 is not required. In some embodiments, a scavenging circuit 88 is provided to collect liquid coolant that seeps into the interior of the enclosure 30 and return the liquid coolant to the fluid reservoir 82.

Figure 4:
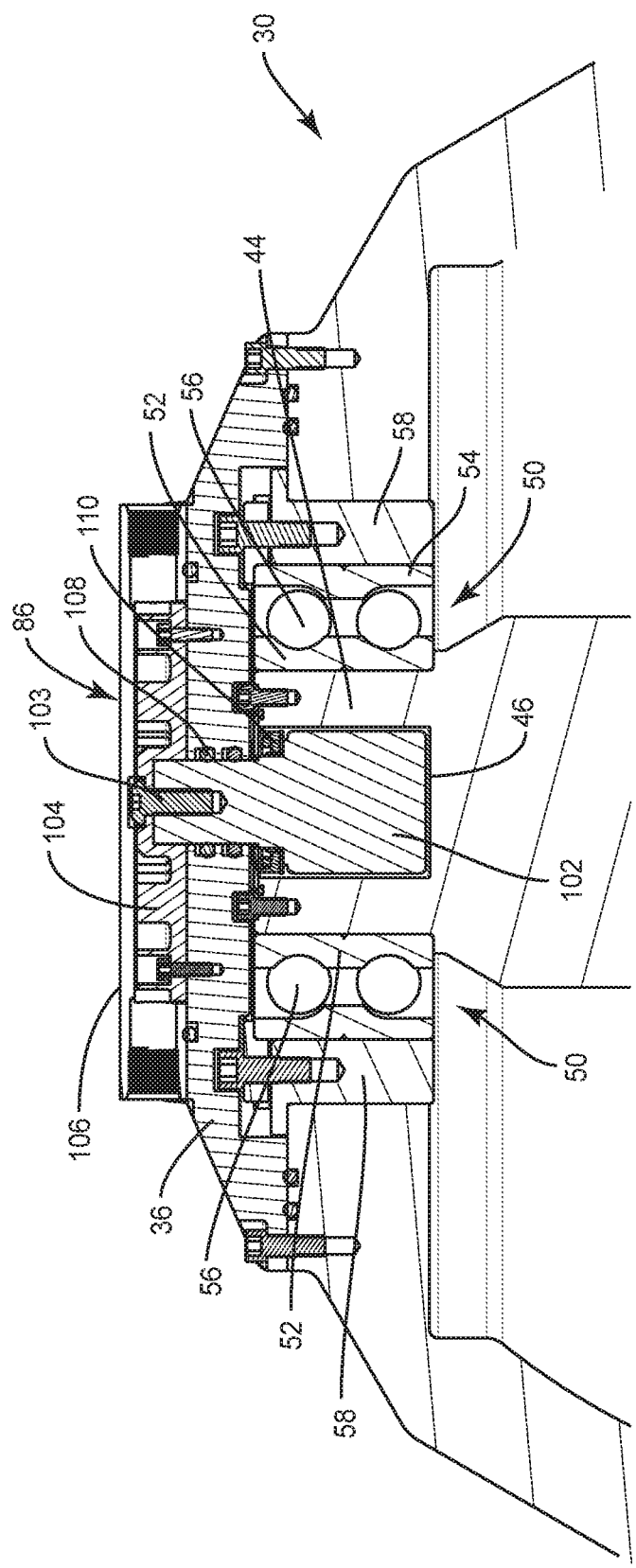
FIG. 4 is a partial section view illustrating the bearing cooling system according to the first embodiment.

FIG. 4 illustrates one embodiment of a bearing cooling system 100 using a heat sink to dissipate heat generated by the bearings 50 and/or motor 60. The upper portion of the flywheel shaft 44 is secured within a bearings 50 that is, in turn, secured within the enclosure 30. Each bearing 50 includes an outer race 54, balls 56 and an inner race 52 that engages the flywheel shaft 44 and rotates therewith. The flywheel shaft 44 includes a cavity 46 at each end thereof. The cavity 46 in each end of the flywheel shaft 44 is open at one end and includes a side wall and a bottom wall.

A heat transfer member 102 that functions as a heat sink is suspended in the cavity 46 as hereinafter described. The heat transfer member 102 does not directly engage the side or bottom walls of the cavity 46. Rather, the outer surface of the heat transfer member 102 is spaced from the side and bottom walls of the cavity 46. In one embodiment, the spacing between the heat transfer member 102 and the walls of the cavity 46 is approximately 0.062". Various materials can be used for the heat transfer member 102 discussed herein. Preferably, copper, aluminum, or alloys thereof are used because of their relatively high thermal conductivity.

A heat transfer medium is contained in the gap between the heat transfer member 102 and the walls of the cavity 46. As one example, the heat transfer medium comprises a low vapor fluid that is suitable for the low pressure environment in the enclosure 30. A low vapor fluid is a liquid, such as oil, that has a relatively low boiling point compared to water and is suitable for employment in a vacuum environment. For example, aerospace lubricants, such as perfluoropolyether (PFPE) lubricants, designed for vacuum environments can be used as the heat exchange medium. The low vapor fluid enables transfer of heat from the flywheel shaft 44 to the heat transfer member 102 by liquid conduction and liquid convection. A labyrinth seal 110 extends around the heat transfer member 102 and effectively seals the cavity 46 such that the heat transfer medium is maintained within the cavity 46. The labyrinth seal 110 is preferably fixed to the heat transfer member 102, which means that the flywheel shaft 44 rotates around the labyrinth seal 110.

As seen in FIG. 4, heat transfer member 102 projects from cavity 46, through an opening in a cover plate 36 forming a part of the enclosure 30, and into a heat exchanger 86. Seals 108 located in corresponding grooves in the cover plate 36 maintain vacuum within the enclosure 30. The heat exchanger 86 is mounted to the exterior surface of the cover plate 36. The heat exchanger 86 comprises a housing 106 and a heat exchange plate 104 confined within the housing 106. The heat transfer member 102 is secured by a fastener 103 to the heat exchange plate 104 so that the heat transfer member 102 is effectively suspended in the cavity 46 formed in the flywheel shaft 44. More particularly, the heat exchange plate 104 includes a recess in the bottom surface thereof that receives the end of the of the heat transfer member 102. The surface contact between the end of the heat transfer member 102 and the heat exchange plate 104 facilitates the efficient transfer of heat by solid conduction from the heat transfer member 102 to the heat exchange plate 104.

A liquid coolant, such as a glycol coolant, is circulated through the heat exchanger 86 to absorb and carry heat away from the heat exchange plate 104 as shown in FIG. 5. The upper surface of the heat exchange plate 104 can be provided with fluid channels and/or cooling fins to increase surface area of the heat exchange plate 104 and to facilitate heat transfer from the heat exchange plate 104 to the liquid coolant.

Heat is generated in the inner and outer races of the bearing assemblies 50 due to the high side loads generated from the CMG's torque as the enclosure 30 rotates about the gimbal axis G. The outer race 54 has a continuous heat conductive path through the enclosure 30 which permits the heat associated with the outer race 54 to be rejected into the atmosphere. The inner race 52 requires a heat sink path through parts of the enclosure 30. In this embodiment, heat from the inner race 52 of the bearing assembly 50 is transferred by solid conduction to the flywheel shaft 44. The heat is then transferred by liquid conduction from the flywheel shaft 44 to the heat transfer member 102, and by solid conduction through the heat transfer member 102 to the heat exchange plate 104 that continuously rejects the heat into surrounding liquid coolant. In some embodiments, the heat exchange 86 could employ air or gas cooling rather than liquid cooling.

Figure 7:
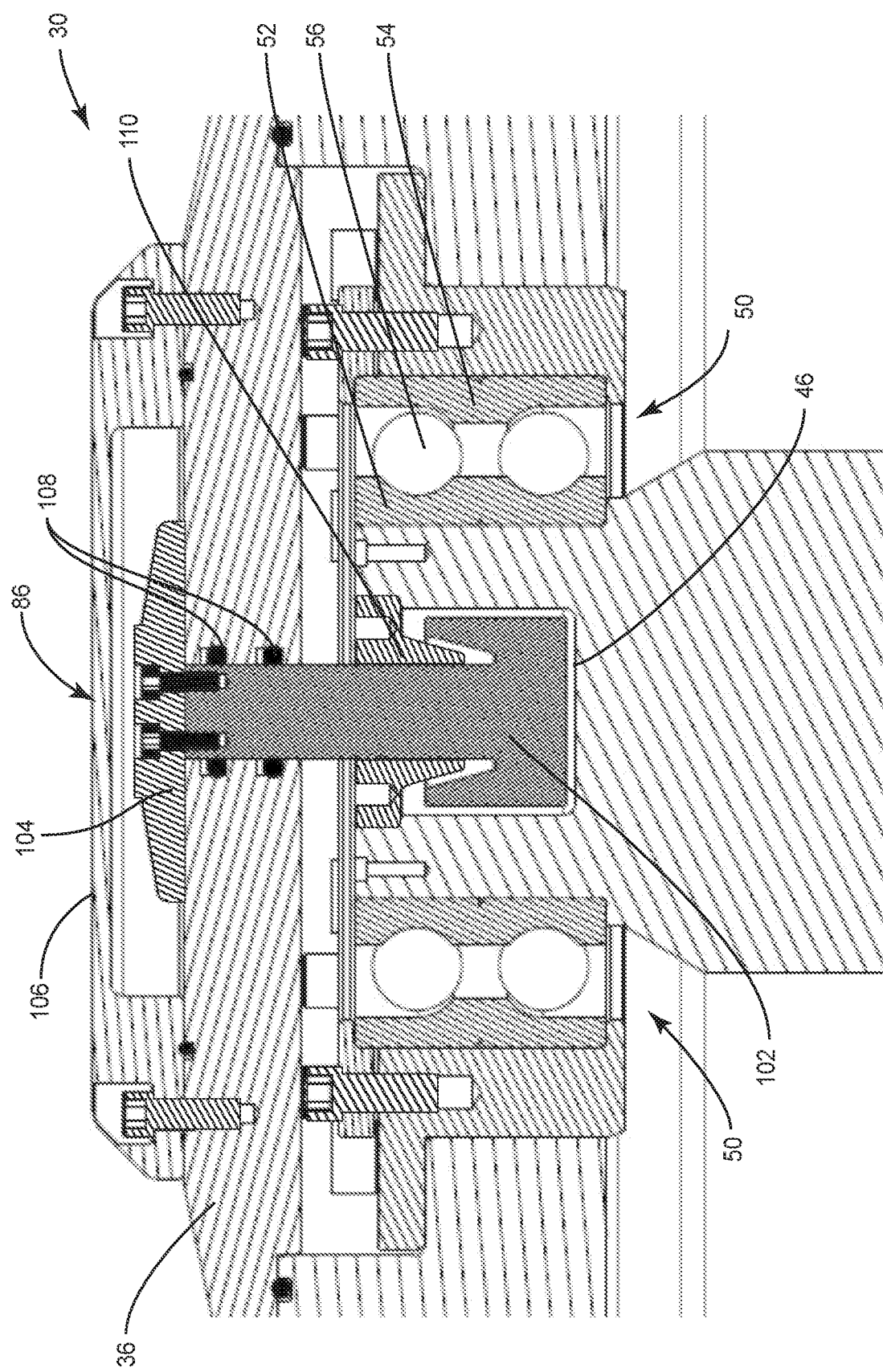
FIG. 7 is a partial section view illustrating the bearing cooling system according to a second embodiment.

FIG. 7 illustrates an alternate bearing cooling system 100 that also uses a heat sink. This bearing cooling system 100 in FIG. 7 is similar to the design shown in FIG. 4. The main differences lie in the shapes of the heat transfer member 102, labyrinth seal 110, and the heat exchange plate 104. In this embodiment, the heat transfer member 102 includes a channel that increases the surface area exposed to the heat transfer medium. The heat exchange plate 104, in contrast to the previous embodiment, has a smooth top surface without grooves or vanes. The heat transfer path, however, is essentially the same. That is, heat associated with the inner race 52 is transferred to the flywheel shaft 44 by solid conduction. The cavity 46 formed in the flywheel shaft 44, like the above design, is configured to hold a low vapor fluid so that heat is transferred by liquid conduction from the flywheel shaft 44 through the low vapor fluid to the lower portion of a heat transfer member 102. Thereafter, heat in the heat transfer member 102 is transferred by solid conduction to the heat exchange plate 104. A liquid coolant is circulated into, through and out the heat exchanger 86. In doing so, the liquid coolant contacts the heat exchange plate 104 and heat associated with the heat exchange plate 104 is transferred to the circulating liquid coolant.

Figure 8:
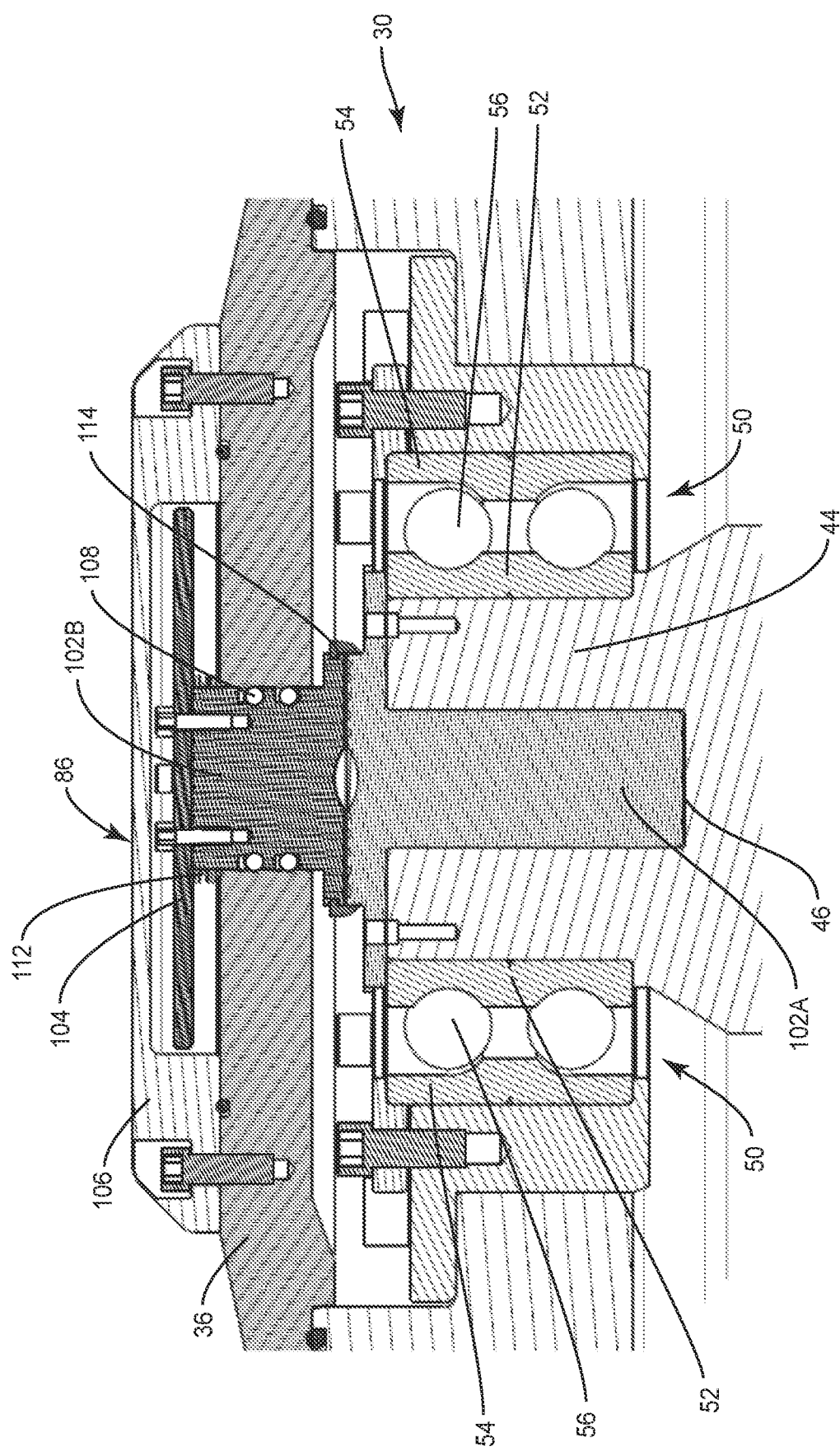
FIG. 8 is a partial section view illustrating the bearing cooling system according to a third embodiment.

FIG. 8 is another alternative design for a bearing cooling system 100 for a gyroscopic boat stabilize using a heat sink. This design is similar in concept to the preceding designs but differs in a number of respects. First, there are two heat transfer members 102A and 102B. Heat transfer member 102A is inserted into the cavity 46 in the flywheel shaft 44 and rotates with the flywheel shaft 44. Close surface contract between the walls of the cavity 46 and the heat transfer member 102A facilitates heat transfer by solid conduction from the flywheel shaft 44 to the heat transfer member 102A. Heat transfer member 102B passes through an opening in the cover plate 36 and is axially aligned with the first heat transfer member 102A. One end of the heat transfer member 102B connects to a heat exchange plate 104. A small gap is maintained between the abutting ends of the heat transfer members 102A and 102B as hereinafter described. A light film of conductive low vapor grease is applied to the interface between the abutting ends of the heat transfer members 102A and 102B to prevent wear and facilitate heat transfer from heat transfer member 102A and heat transfer member 102B. The grease is prevented from escaping by a labyrinth seal 114. In the course of dissipating heat from the inner race 52 of a bearing assembly 50, heat is transferred from the inner heat transfer member 102A through the thin film of grease to the outer heat transfer member 102B.

A pre-loaded spring 112 is interposed between the heat exchange plate 104 and the cover plate 36 of the enclosure 30. The reason for this is that the vacuum in the enclosure 30 tends to pull the outer heat transfer member 102B inwardly. Thus, the spring 112 is employed to counterbalance the vacuum force and to maintain a desired spacing between the heat transfer members 102A and 102B.

The heat transfer path in this design is essentially the same as the two previous embodiments. Heat associated with the inner race 52 of the bearing assembly 50 is transferred by solid conduction from the inner race 52 to the flywheel shaft 44 and from the flywheel shaft 44 to first heat transfer member 102A. Heat in the first heat transfer member 102A is transferred by conduction through the thin film of grease to the second heat transfer member 102B, and by solid conduction from the heat transfer member 102B to the heat exchange plate 104. The liquid coolant circulating in the heat exchanger 86 adsorbs and carries away the heat in the heat exchange plate 104.

FIGS. 9-14 illustrate embodiments of a bearing cooling system 100 in which heat is transferred to a liquid coolant that is circulated in the cavity 46 in the end of the flywheel shaft 44. In this case, the heat transfer to the liquid coolant occurs within the cavity 46 in the flywheel shaft 44. The following discussion will focus primarily on the elements involved in the heat transfer. Except where noted below, the basic design of the gimbal 20, enclosure, 30, flywheel 40, bearing assemblies 50 and motor 60 (not shown) are essentially the same as previously described. Therefore, the following description will not reiterate all of the details of these elements. In the embodiments shown in FIGS. 9 and 10, the ends of the flywheel shaft 44 include specially formed cavities 46 into which the liquid coolant is delivered or injected. Each cavity 46 extends along the longitudinal axis of the flywheel shaft 44 so that the bottom or closed end of the cavity 46 is adjacent the bearing 50. The cavity 46 tapers outwardly as it extends towards the end of the flywheel shaft 44. A feed tube 85 delivers the liquid coolant to the bottom end of the cavity 46. The shape of the cavity 46 causes the liquid coolant to flow along the side walls of the cavity 46 towards the end of the flywheel shaft 44 when the shaft 44 rotates at a high speed. A collection manifold 90 connected to the input side of the fluid reservoir 82 is disposed adjacent the open end of the cavity 46 to collect and recirculate the liquid coolant flowing from the open end of the cavity 46 in the flywheel shaft 44. A labyrinth seal provides a non-contact seal between the end of the flywheel shaft 44 and the collection manifold 90.

The collection manifold 90 comprises a generally circular manifold with an opening 92 in the bottom wall thereof and one or more fluid outlets 93 along the sidewall of the manifold 90 through which oil or liquid coolant is recirculated. The feed tube 85 passes through an opening 96 in the top wall of manifold 90, which is sealed by an o-ring seal 98. Additionally, a resilient deflector shield 95 is attached to the feed tube 85 to deflect fluid away from the opening 96 in the top wall of the collection manifold 90. A rounded protrusion 94 is formed around the perimeter of the opening 92 on the interior side of the bottom wall of the manifold 90. As explained in more detail below, the rounded protrusion 94 forms part of the labyrinth seal to prevent oil from seeping into the interior of the enclosure 30.

Figure 9:
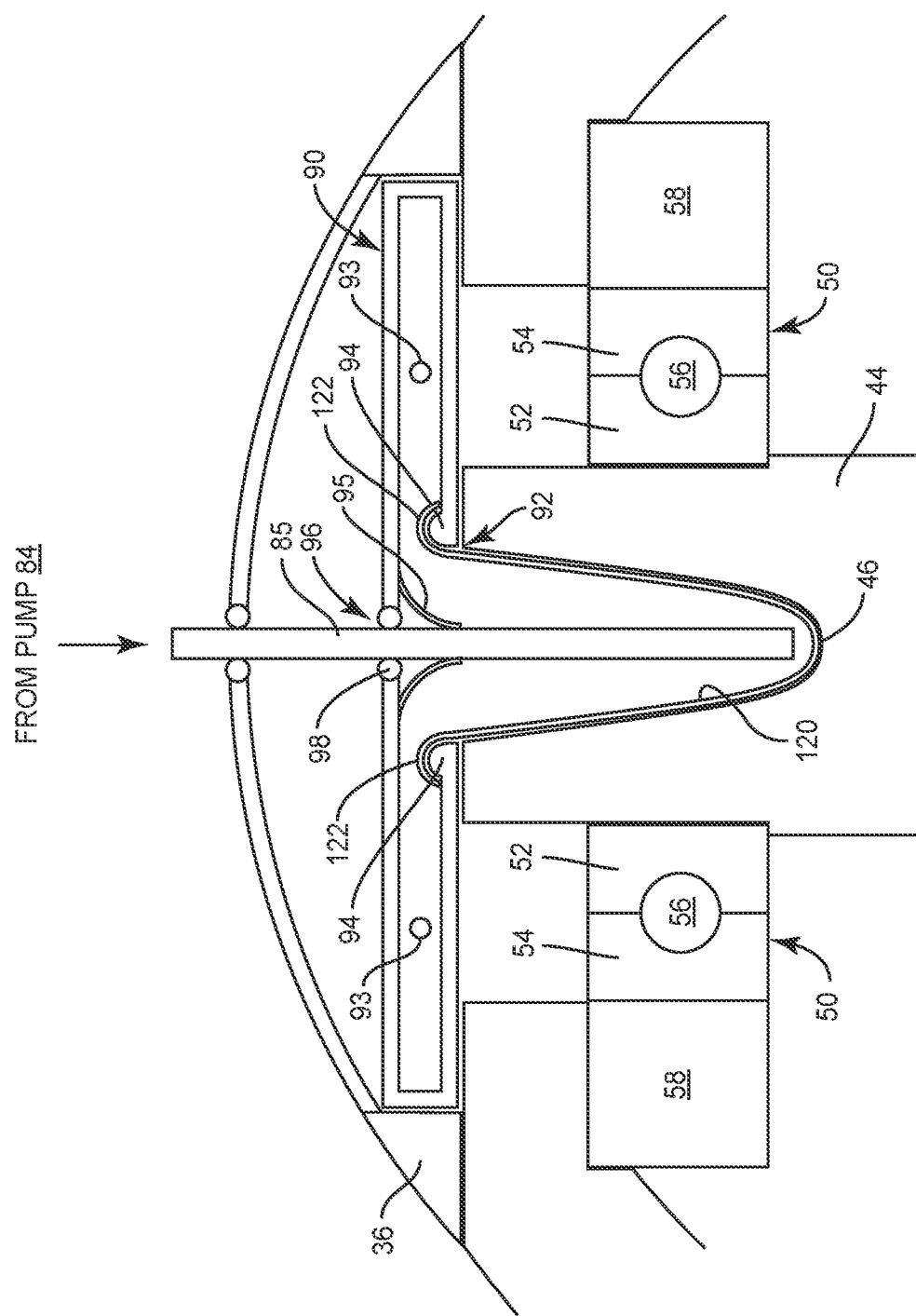
FIG. 9 is a partial section view illustrating the bearing cooling system according to a fourth embodiment.

In the embodiment shown in FIG. 9, a bell-shaped liner 120 is inserted into each cavity 46 in the flywheel shaft 44. The liner 120 includes a flared end 122 that extends radially outward and over the rounded protrusion 94 surrounding the opening 92 in the bottom of the collection manifold 90 with a gap between the flared end 122 and the rounded protrusion 94 in the range of $1/128$ inches to $1/32$ inches to form the labyrinth seal. The size of the gap and the rotation of the liner 120 with the flywheel shaft 44 prevents fluid from migrating into the interior of the enclosure 30. In the event that liquid coolant leaks past the labyrinth seal, it can be collected and returned by a scavenging circuit 88.

Figure 10:
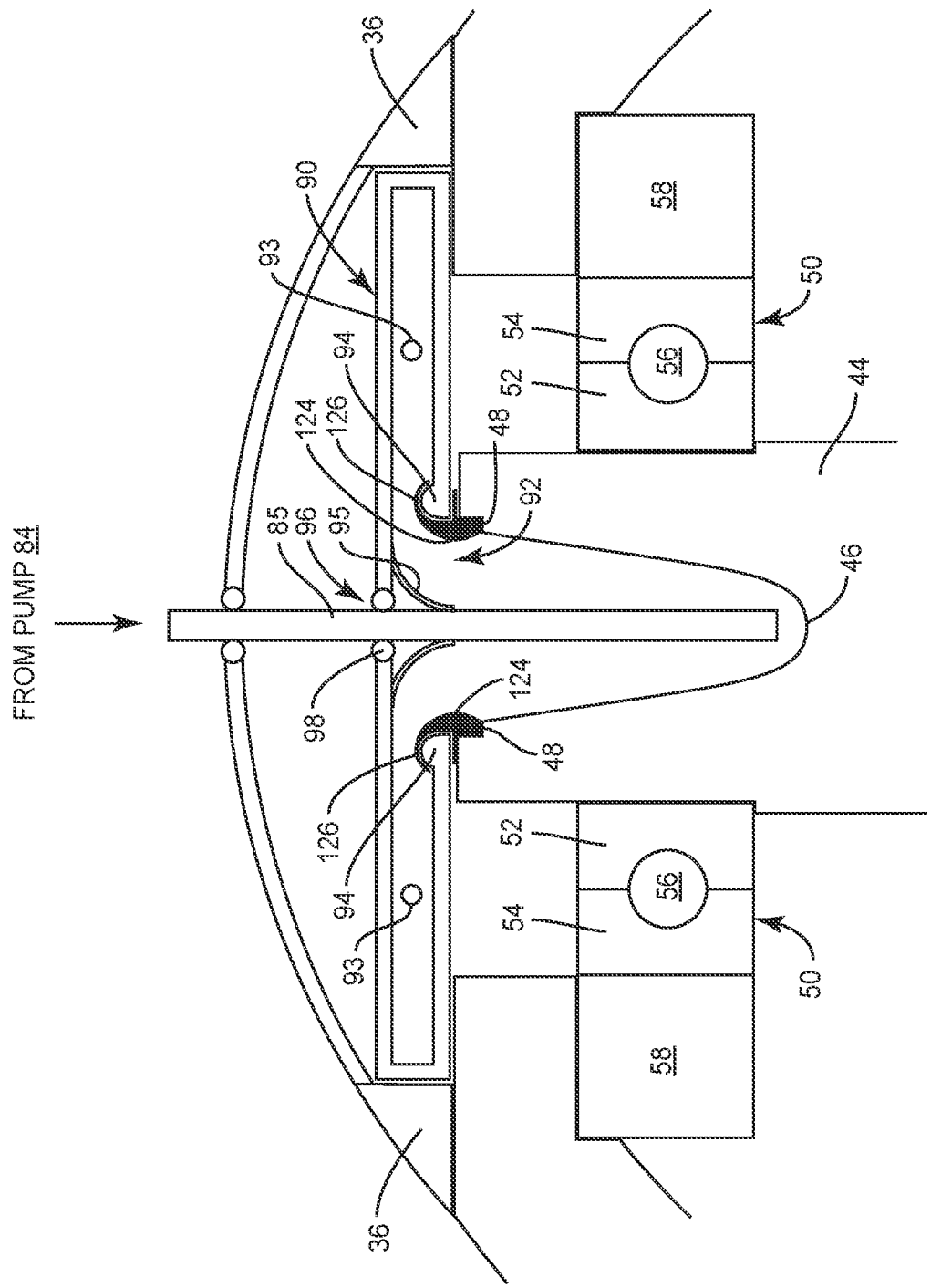
FIG. 10 is a partial section view illustrating the bearing cooling system according to a fifth embodiment.

FIG. 10 illustrates an alternative system for forming a labyrinth seal. In this embodiment, a shoulder 48 is formed in the side wall of the fluid cavity 46 adjacent the open end of the flywheel shaft 44. An annular sealing member 124, shown best in FIG. 10, is inserted into the open end of the cavity 46. The inner surface of the sealing member 124 bulges inwardly towards the axis of rotation of the flywheel shaft 44. As the liquid coolant flows towards the open end of the cavity 46, the fluid encounters the bulge, which directs the fluid flow towards the axis of rotation of the flywheel shaft 44 and reduces the flow rate of the fluid. As a result, the liquid coolant remains in contact with the flywheel shaft 44 for a longer period of time and absorbs a greater amount of heat. The outer end of the sealing member 124 includes a finger-like element 126 that extends over the rounded protrusion 92 surrounding the opening in the collection manifold 90 with a gap between the finger-like element 126 and the rounded protrusion 94 in the range of $\frac{1}{128}$ inches to $\frac{1}{32}$ inches to form the labyrinth seal. As in the previous embodiment, the size of the gap and the rotation of the sealing member 124 prevent the liquid coolant from migrating into the interior of the enclosure 30.

Figure 11:
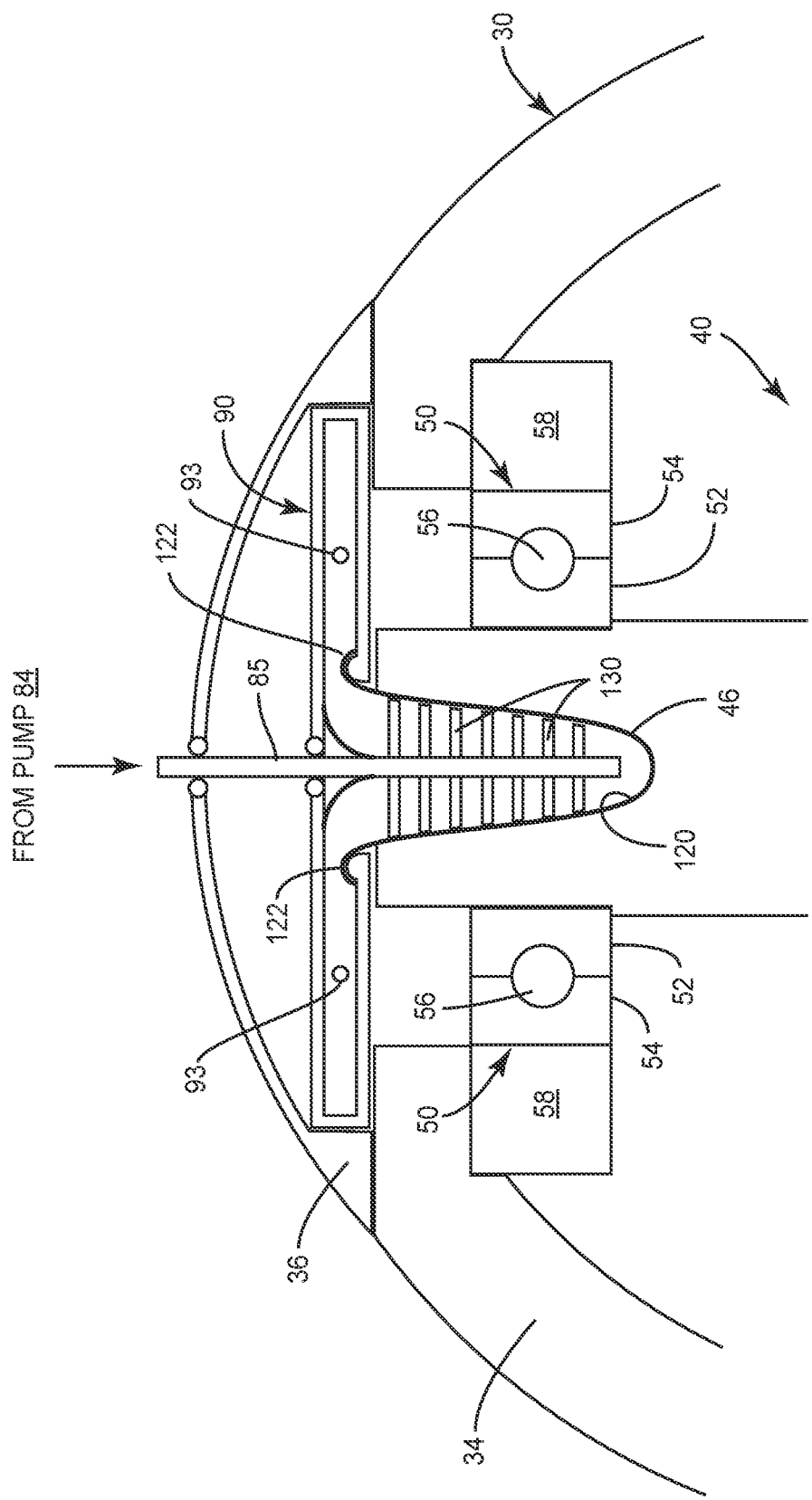
FIG. 11 is a partial section view illustrating the bearing cooling system according to a sixth embodiment.
Figure 12:
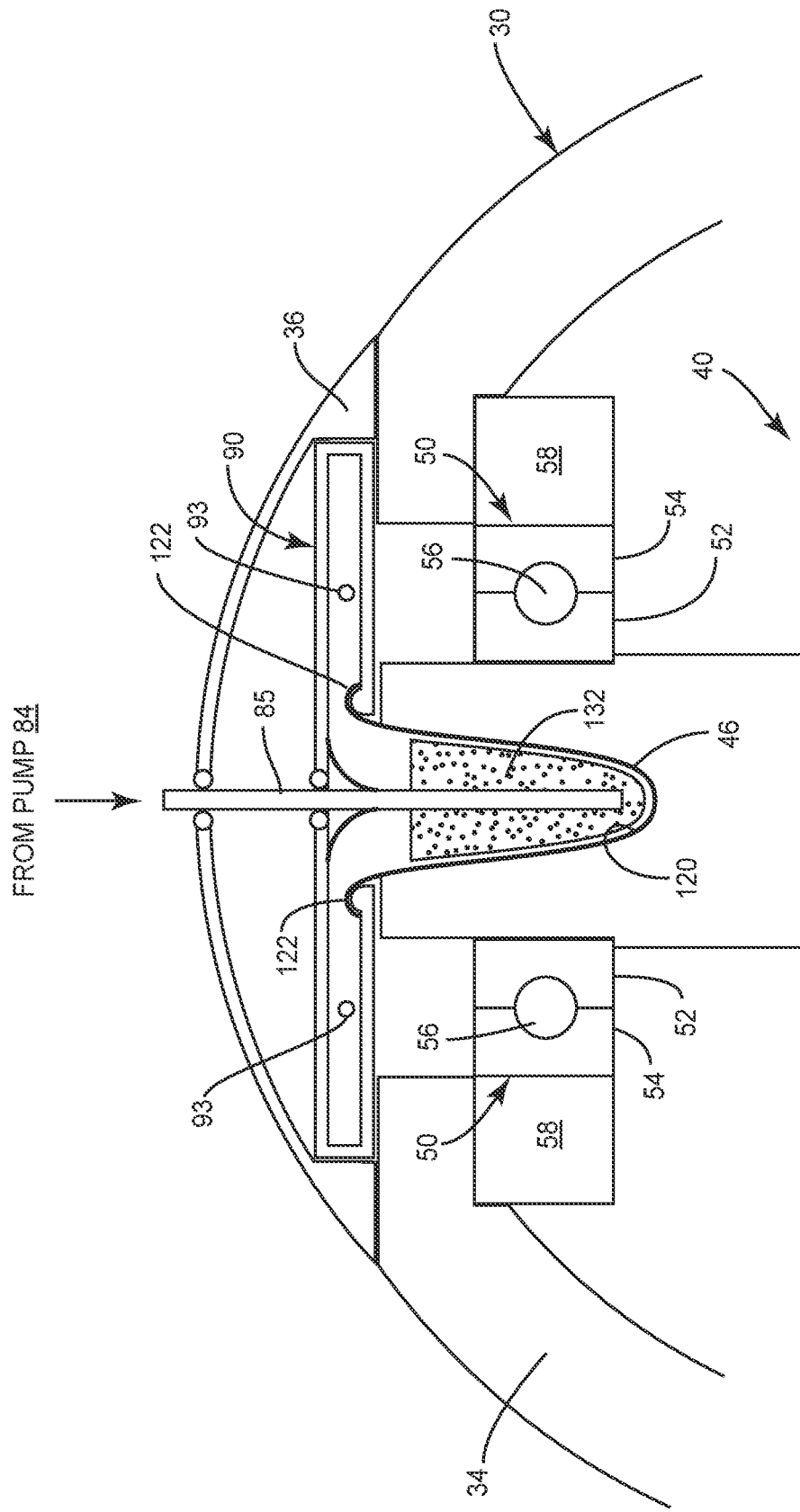
FIG. 12 is a partial section view illustrating the bearing cooling system according to a seventh embodiment.

FIGS. 11 and 12 show embodiments similar to the embodiment in FIGS. 9 and 10 with additional flow control features to control the flow of liquid coolant from the cavities 46 in the ends of the shaft 44. Generally, the flow control features are designed to slow down the flow of oil or liquid coolant to provide sufficient time for heat exchange, i.e. for the transfer of heat from the shaft 44 to the oil or liquid coolant. In the embodiment shown in FIG. 11, a series of solid disks 130 are attached to the feed tube 85 and extend radially outward towards the liner 120. The flow of oil or liquid coolant is restricted to a small gap between the outer edge or periphery of the disks 130 and the liner 120. In the embodiment shown in FIG. 12, a porous material 132, such as a metal foam, is placed in the cavity 46 in the flywheel shaft 44 with a bore down the center for the feed tube 85. Oil or liquid coolant delivered via the feed tube 85 flows back out through the porous metal foam or other porous material 132, which transfers heat to the oil or liquid coolant. Other similar techniques may also be used to slow down the flow of oil or liquid coolant to provide time for heat transfer.

In another embodiment, the bearing cooling system 100 comprises a conductive metal cap (not shown) is attached to the end of the flywheel shaft 44 that contacts the inner race 52 of the flywheel bearings 50. In one embodiment, the metal cap further includes elongated conductive elements that extend into similarly formed grooves in the flywheel shaft 44 to conduct heat from the flywheel shaft 44 to the metal cap. Liquid coolant is sprayed on to the metal cap. The rotation of the flywheel shaft 44 causes the liquid coolant to flow outward where it is collected by a fluid collection system. A labyrinth seal provides a non-contact seal between the metal cap and the fluid collection system to reduce frictional forces acting on the flywheel shaft 44.

The bearing cooling systems 100 as herein described allow much greater heat dissipation compared to current technology, which enables use of a larger motor 60 and lower operating temperature, even with the larger motor 60. The larger motor and lower operating temperature enable rapid spin up and spin down of the flywheel assembly 40, and a much lower time to engage.

In use, the gimbal 20 is normally locked during spin up, i.e., while the flywheel assembly 40 is being accelerated, to prevent precession of the flywheel 42 until a predetermined rotational speed is achieved. In conventional CMGs, the gimbal 20 is typically locked until the flywheel assembly 40 reaches 75-80% or more of the maximum rotational speed. Locking the gimbal 20 is necessary to prevent frictional losses while the flywheel assembly 40 is being accelerated. If the gimbal 20 in a conventional CMG is unlocked too early, the frictional losses will prevent the smaller motors from accelerating the flywheel assembly 40, or will greatly diminish the acceleration of the flywheel assembly 40 resulting in a much longer spin up period.

The current state of the art in bearing cooling for a CMG 10 maintained in a vacuum environment uses interwoven fins and relies primarily on gaseous conduction between the interwoven fins to dissipate the heat. See, e.g., U.S. Pat. Nos. 7,546,782 and 8,117,930. The reliance on gaseous conduction as the primary mode of heat transfer severely limits the amount of heat that can be dissipated since gaseous conduction is less efficient than liquid or solid conduction. The heat transfer capacity of the interwoven fins is also limited by the surface area of the interwoven fins. Less surface area means less heat transfer capacity. As the enclosure 30 of the CMG 10 shrinks is size, there is less space available for the interwoven fins. These factors place severe limits on the heat budget for the CMG 10.

There are two main sources of heat in the CMG 10: heat generated by the motor 60 inside the enclosure 30 and heat generated by bearing friction. A large percentage of the heat budget is needed to dissipate heat from the bearings 50 in order to prevent bearing failure. The remaining portion of the heat budget after accounting for bearing cooling determines the size of the motor 60 that can be used inside the enclosure 30. Thus, conventional CMGs 10 using interwoven fins for heat dissipation are limited in the size of the motor 60. If the motor 60 is too large so that the heat transfer capacity of the interwoven fins is exceeded, The limitation on the motor size results in a poor acceleration profile for the flywheel 42 in CMGs 10, which in turn means a long waiting period before the CMG 10 can be used. A boater will typically desire to use the CMG 10 as soon as possible after getting underway. As noted previously, the CMG 10 is typically locked with the flywheel assembly 40 in a vertical positions until the flywheel 42 reaches the minimum operating speed (typically approximately 75% to 80% of its normal operating speed) is reached. CMGs 10 currently on the market may take 30 minutes or longer to reach the minimum operating speed at which the flywheel 42 can be engaged, while many boat trips, particularly on smaller boats, are 30 minutes or less. This means the waiting period before the time to engage (unlock the flywheel assembly 40) is reached is longer than many boat trips.

The size of the motor 60 in conventional CMGs 10 place a floor on the minimum operating speed at which the CMG 10 can be engaged (i.e., unlocked). The CMG 10 is typically locked to prevent precession when the flywheel assembly 40 is being accelerated. The CMG 100 can be locked to prevent rotation of the enclosure 30 by the active braking system 78. When the CMG 10 is unlocked, the precession of the flywheel 42 will place large side loads on the bearings 50. The bearing friction from the side loading of the bearings 50 that must be overcome by the motor 60, which will dramatically decrease the already slow acceleration rate. The lower acceleration rate means that the time to reach the normal operating speed could be in the order or several hours instead of tens of minutes, which would not be acceptable to a typical boater. In some cases, the frictional load may be too for the motor 60 to overcome so that the further acceleration of the flywheel assembly 40 becomes impossible and the normal operating speed cannot be reached.

Another consideration is that the power to the motor 60 is at its maximum when the flywheel assembly 40 is being accelerated, and is reduced when the flywheel assembly 40 reaches its normal operating speed. Thus, more heat is generated by the motor 60 when it is accelerating. The additional heat generated by the motor 60 also limits the time to engage because the additional heat from the motor 60 may exceed the design limits of the bearing cooling system.

The bearing cooling systems 100 as described herein enable more efficient heat transfer, which enables a far greater heat transfer capacity and a greatly increased heat budget. The increased heat budget means that larger and more powerful motors 60 that generate more heat can be used without fear of a bearing failure. With a larger and more powerful motor 60, the CMG 10 is able to achieve greater acceleration of the flywheel assembly 40 and much lower time to engage than a conventional CMG 10. In addition to the higher rates of acceleration, which naturally lead to lower times to engage assuming the same minimum operating speed, a larger motor 60 enables the flywheel assembly 40 to be engaged at a lower operating speed, which further reduces the time to engage, because the larger motor 60 is able to overcome the additional friction from the loading of the bearings 50. In some embodiments, the motor 60 is configured to enable the CCG 10 to be unlocked in under 20 minutes, and preferably in under 10 minutes and more preferably in under 5 minutes. By combining higher acceleration with lower operating speeds at the time of engagement, a time to engage can be reduced to a few minutes. For example, a motor 60 rated at 10,000 to 15,000 watts could potentially achieve a time to engage rates in the order of a few minutes.

As one example, the flywheel assembly 40 described above with a moment of inertia equal to about 9.44 kg·m$^2$ (32,273 lbm in$^2$) can be accelerated from rest to 9000 rpm in about 30 minutes or less, which equates to an average acceleration of about 5 rpm/s or more, and preferably in about 20 minutes or less, which equates to an average acceleration of about 7.5 rpm/s or more, and even more preferably in about 10 minutes or less, which equates to an average acceleration of about 15 rpm/s or more. Additionally, the time to engage for the CMG 10 as herein described is much shorter because the motor 60 is powerful enough to overcome the frictional losses when the gimbal 20 is unlocked. For example, in a flywheel assembly 40 with a moment of inertia equal to about 9.44 kg·m$^2$ (32,273 lbm in$^2$), the time to engage (assuming 75% of operating speed) is less than about 20 minutes, and more preferably less than about 10 minutes, and even more preferably less than 5 minutes. The rapid spin up and shorter time to engage enables beneficial use of the CMG 10 even for short trip times, which makes up a majority of boating trips. Thus, the rapid spin-up enables the CMG 10 to be used on a far greater number of boating occasions.

Similarly, the spin down is in the order of minutes rather than hours compared to the current technology. Cooling systems with interleaved fins that rely on gaseous conduction and convection operate at a high temperature (e.g. 400 degrees F.) and dissipate heat relatively slowly. In such systems, if the flywheel is stopped too fast, the heat may cause components too warp, which in turn may cause bearing life to be shortened to months or days as opposed to years. The cooling system as herein describe enables the CMG 10 to operate at a lower temperature (e.g. 200 degrees F.) and is extremely efficient at removing heat. Consequently, the spin down time is cut from 3-5 hours to just a few minutes. This reduced running temperature as well as the rapid cooldown period prevents the extremely well balanced rotating components from warping and thus the spin down time is greatly reduced. The short spin down time eliminates the annoying hum and vibration from the spinning flywheel and allows enjoyment of the peace and serenity after returning from a day of boating.

Generally, CMGs 10 with relatively small flywheels operate at higher rotational speeds than CMGs 10 with larger flywheels. The smaller CMGs 10 typically include flywheels weighing 700 lbs or less rotating at 9000 rpm or more and with a moment of inertia less than 11.7 kg·m$^2$ (40000 lbm in$^2$). The smaller CMGs 10 typically include flywheels 42 weighing 700 lbs or less rotating at 9000 rpm or more and with a moment of inertia less than 11.7 kg·m$^2$ (40000 lbm in$^2$). The larger CMGs 10 typically include flywheels 42 weighing greater than 700 lbs rotating at less than 9000 rpm with a moment of inertia greater than 11.7 kg·m$^2$ (40000 lbm in$^2$).

Table 1 below shows the spin-up time and time to engage for eight different CMGs 100 where the acceleration rate is 5 rpm/s for the smaller CMGs 10 and 2.5 rpm/s for the larger CMGs 10. The time to engage is assumed to be at the point when the flywheel assembly 40 reaches 75% of its normal operating speed.

TABLE 1

Spin-up Time and Time to Engage-Example 1

| | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 22.5 | 30 | 125 | <40 | 9000 | 5 |
| Model 2 | 22.5 | 30 | 250 | 40-60 | 9000 | 5 |
| Model 3 | 22.5 | 30 | 325 | 60-90 | 9000 | 5 |
| Model 4 | 22.5 | 30 | 425 | 90-200 | 9000 | 5 |
| Model 5 | 22.5 | 30 | 600 | 200-500 | 9000 | 5 |
| Model 6 | 30 | 40 | 1000 | 500-800 | 6000 | 2.5 |
| Model 7 | 30 | 40 | 1500 | 800-1200 | 6000 | 2.5 |
| Model 8 | 30 | 40 | 1900 | >1200 | 6000 | 2.5 |

Table 2 below shows the spin-up time and time to engage for eight different CMGs 100 where the acceleration rate is 10 rpm/s for the smaller CMGs 10 and 5 rpm/s for the larger CMGs 10. The time to engage is assumed to be at the point when the flywheel assembly 40 reaches 75% of its normal operating speed.

TABLE 2

Spin-up Time and Time to Engage Example 2

| | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 11.25 | 15 | 125 | <40 | 9000 | 10 |
| Model 2 | 11.25 | 15 | 250 | 40-60 | 9000 | 10 |
| Model 3 | 11.25 | 15 | 325 | 60-90 | 9000 | 10 |
| Model 4 | 11.25 | 15 | 425 | 90-200 | 9000 | 10 |
| Model 5 | 11.25 | 15 | 600 | 200-500 | 9000 | 10 |
| Model 6 | 15 | 20 | 1000 | 500-800 | 6000 | 5 |
| Model 7 | 15 | 20 | 1500 | 800-1200 | 6000 | 5 |
| Model 8 | 15 | 20 | 1900 | >1200 | 6000 | 5 |

Table 3 below shows the spin-up time and time to engage for eight different CMGs 100 where the acceleration rate is 5 rpm/s for the smaller CMGs 10 and 7.5 rpm/s for the larger CMGs 10. The time to engage is assumed to be at the point when the flywheel assembly 40 reaches 75% of its normal operating speed.

TABLE 3

Spin-up Time and Time to Engage Example 3

| | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 7.5 | 10 | 125 | <40 | 9000 | 15 |
| Model 2 | 7.5 | 10 | 250 | 40-60 | 9000 | 15 |
| Model 3 | 7.5 | 10 | 325 | 60-90 | 9000 | 15 |
| Model 4 | 7.5 | 10 | 425 | 90-200 | 9000 | 15 |
| Model 5 | 7.5 | 10 | 600 | 200-500 | 9000 | 15 |
| Model 6 | 10 | 13.33 | 1000 | 500-800 | 6000 | 7.5 |
| Model 7 | 10 | 13.33 | 1500 | 800-1200 | 6000 | 7.5 |
| Model 8 | 10 | 13.33 | 1900 | >1200 | 6000 | 7.5 |

Table 4 below shows the spin-up time and time to engage for eight different CMGs 100 where the acceleration rate is 2.5 rpm/s for the smaller CMGs 10 and 5 rpm/s for the larger CMGs 10. The time to engage is assumed to be at the point when the flywheel assembly 40 reaches 75% of its normal operating speed.

TABLE 4

Spin-up Time and Time to Engage Example 4

| | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 5.625 | 7.5 | 125 | <40 | 9000 | 20 |
| Model 2 | 5.625 | 7.5 | 250 | 40-60 | 9000 | 20 |
| Model 3 | 5.625 | 7.5 | 325 | 60-90 | 9000 | 20 |
| Model 4 | 5.625 | 7.5 | 425 | 90-200 | 9000 | 20 |
| Model 5 | 5.625 | 7.5 | 600 | 200-500 | 9000 | 20 |
| Model 6 | 7.5 | 10 | 1000 | 500-800 | 6000 | 10 |
| Model 7 | 7.5 | 10 | 1500 | 800-1200 | 6000 | 10 |
| Model 8 | 7.5 | 10 | 1900 | >1200 | 6000 | 10 |

In the examples shown in Tables 1-4, it is assumed that the CMG 10 is engaged, i.e. unlocked, when the flywheel assembly 40 reaches 75% of its normal operating speed. One of the advantages of the present disclosure is that larger motors 60 can be used that are able overcome frictional losses in the bearings 50 when the CMG 10 is unlocked. Thus, the time to engage can be reduced even more by unlocking the CMG 10 when the flywheel assembly reaches 50% of its normal operating speed, or even 25% of its normal operating speed.

Tables 5-8 show the time to engage in scenarios where the CMG 10 is unlocked when the flywheel assembly 40 reaches 50% of normal operating speed.

TABLE 5

Spin-up Time and Time to Engage-Example 5

| | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 15 | 30 | 125 | <40 | 9000 | 5 |
| Model 2 | 15 | 30 | 250 | 40-60 | 9000 | 5 |
| Model 3 | 15 | 30 | 325 | 60-90 | 9000 | 5 |
| Model 4 | 15 | 30 | 425 | 90-200 | 9000 | 5 |
| Model 5 | 15 | 30 | 600 | 200-500 | 9000 | 5 |
| Model 6 | 20 | 40 | 1000 | 500-800 | 6000 | 2.5 |
| Model 7 | 20 | 40 | 1500 | 800-1200 | 6000 | 2.5 |
| Model 8 | 20 | 40 | 1900 | >1200 | 6000 | 2.5 |

TABLE 6

Spin-up Time and Time to Engage Example 6

| | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 7.25 | 15 | 125 | <40 | 9000 | 10 |
| Model 2 | 7.25 | 15 | 250 | 40-60 | 9000 | 10 |
| Model 3 | 7.25 | 15 | 325 | 60-90 | 9000 | 10 |
| Model 4 | 7.25 | 15 | 425 | 90-200 | 9000 | 10 |
| Model 5 | 7.25 | 15 | 600 | 200-500 | 9000 | 10 |
| Model 6 | 10 | 20 | 1000 | 500-800 | 6000 | 5 |
| Model 7 | 10 | 20 | 1500 | 800-1200 | 6000 | 5 |
| Model 8 | 10 | 20 | 1900 | >1200 | 6000 | 5 |

TABLE 7

Spin-up Time and Time to Engage Example 7

| | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 5 | 10 | 125 | <40 | 9000 | 15 |
| Model 2 | 5 | 10 | 250 | 40-60 | 9000 | 15 |
| Model 3 | 5 | 10 | 325 | 60-90 | 9000 | 15 |
| Model 4 | 5 | 10 | 425 | 90-200 | 9000 | 15 |
| Model 5 | 5 | 10 | 600 | 200-500 | 9000 | 15 |
| Model 6 | 6.67 | 13.33 | 1000 | 500-800 | 6000 | 7.5 |
| Model 7 | 6.67 | 13.33 | 1500 | 800-1200 | 6000 | 7.5 |
| Model 8 | 6.67 | 13.33 | 1900 | >1200 | 6000 | 7.5 |

TABLE 8

Spin-up Time and Time to Engage Example 8

| | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 3.75 | 7.5 | 125 | <40 | 9000 | 20 |
| Model 2 | 3.75 | 7.5 | 250 | 40-60 | 9000 | 20 |
| Model 3 | 3.75 | 7.5 | 325 | 60-90 | 9000 | 20 |
| Model 4 | 3.75 | 7.5 | 425 | 90-200 | 9000 | 20 |
| Model 5 | 3.75 | 7.5 | 600 | 200-500 | 9000 | 20 |
| Model 6 | 5 | 10 | 1000 | 500-800 | 6000 | 10 |
| Model 7 | 5 | 10 | 1500 | 800-1200 | 6000 | 10 |
| Model 8 | 5 | 10 | 1900 | >1200 | 6000 | 10 |

Tables 9-12 show the time to engage in scenarios where the CMG 10 is unlocked when the flywheel assembly 40 reaches 25% of normal operating speed.

TABLE 9

Spin-up Time and Time to Engage-Example 9

|  | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 7.5 | 30 | 125 | <40 | 9000 | 5 |
| Model 2 | 7.5 | 30 | 250 | 40-60 | 9000 | 5 |
| Model 3 | 7.5 | 30 | 325 | 60-90 | 9000 | 5 |
| Model 4 | 7.5 | 30 | 425 | 90-200 | 9000 | 5 |
| Model 5 | 7.5 | 30 | 600 | 200-500 | 9000 | 5 |
| Model 6 | 10 | 40 | 1000 | 500-800 | 6000 | 2.5 |
| Model 7 | 10 | 40 | 1500 | 800-1200 | 6000 | 2.5 |
| Model 8 | 10 | 40 | 1900 | >1200 | 6000 | 2.5 |

TABLE 10

Spin-up Time and Time to Engage Example 10

|  | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 3.75 | 15 | 125 | <40 | 9000 | 10 |
| Model 2 | 3.75 | 15 | 250 | 40-60 | 9000 | 10 |
| Model 3 | 3.75 | 15 | 325 | 60-90 | 9000 | 10 |
| Model 4 | 3.75 | 15 | 425 | 90-200 | 9000 | 10 |
| Model 5 | 3.75 | 15 | 600 | 200-500 | 9000 | 10 |
| Model 6 | 5 | 20 | 1000 | 500-800 | 6000 | 5 |
| Model 7 | 5 | 20 | 1500 | 800-1200 | 6000 | 5 |
| Model 8 | 5 | 20 | 1900 | >1200 | 6000 | 5 |

TABLE 11

Spin-up Time and Time to Engage Example 11

|  | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | 2.5 | 10 | 125 | <40 | 9000 | 15 |
| Model 2 | 2.5 | 10 | 250 | 40-60 | 9000 | 15 |
| Model 3 | 2.5 | 10 | 325 | 60-90 | 9000 | 15 |
| Model 4 | 2.5 | 10 | 425 | 90-200 | 9000 | 15 |
| Model 5 | 2.5 | 10 | 600 | 200-500 | 9000 | 15 |
| Model 6 | 3.33 | 13.33 | 1000 | 500-800 | 6000 | 7.5 |
| Model 7 | 3.33 | 13.33 | 1500 | 800-1200 | 6000 | 7.5 |
| Model 8 | 3.33 | 13.33 | 1900 | >1200 | 6000 | 7.5 |

TABLE 12

Spin-up Time and Time to Engage Example 12

|  | Time to engage (min) | Spin-up time (min) | Weight (lbs) | Moment of Inertia (lb ft$^2$) | Speed RPM) | Acceleration (RPM/s) |
|---|---|---|---|---|---|---|
| Model 1 | >2 | 7.5 | 125 | <40 | 9000 | 20 |
| Model 2 | >2 | 7.5 | 250 | 40-60 | 9000 | 20 |
| Model 3 | >2 | 7.5 | 325 | 60-90 | 9000 | 20 |
| Model 4 | >2 | 7.5 | 425 | 90-200 | 9000 | 20 |
| Model 5 | >2 | 7.5 | 600 | 200-500 | 9000 | 20 |
| Model 6 | 2.5 | 10 | 1000 | 500-800 | 6000 | 10 |
| Model 7 | 2.5 | 10 | 1500 | 800-1200 | 6000 | 10 |
| Model 8 | 2.5 | 10 | 1900 | >1200 | 6000 | 10 |

The bearing cooling systems 100 as herein described enable faster acceleration rates for the flywheel assembly 40, which translates to a lower time to engage the CMG 10. The lower time to engage in turn will enable beneficial use of the CMG 10 even on trips of short duration. For smaller units, the bearing cooling system 100 is effective to enable a flywheel assembly 40 with a moment of inertia less than 11.7 kg·m$^2$ (40000 lbm in$^2$) to be accelerated at a rate of 5 rpm/s or greater. Accelerations rates greater than 30 rpm/s for the smaller units are achievable. For larger units, the bearing cooling system is effective to enable a flywheel assembly 40 with a moment of inertia greater than 11.7 kg·m$^2$ (40000 lbm in$^2$) to be accelerated at a rate of 2.5 rpm/s or greater. Accelerations rates greater than 15 rpm/s for the larger units are achievable. The bearing cooling system also enable fast spin down times so that the quiet enjoyment of the boat is not disturbed by the noise emanating from the flywheel assembly 40 as it winds down.

What is claimed is:

1. A gyroscopic roll stabilizer for a boat, said gyroscopic stabilizer comprising:
   an enclosure mounted to a gimbal for rotation about a gimbal axis and configured to maintain a below-ambient pressure;
   a flywheel assembly including a flywheel and flywheel shaft, said flywheel assembly having a moment of inertia greater than 11.7 kg·m$^2$ (40,000 lbm·in$^2$); the flywheel assembly configured to precess relative to the gimbal axis, when unlocked, in response to roll of the boat;
   one or more bearings for rotatably mounting the flywheel assembly inside the enclosure;
   a motor for rotating the flywheel assembly, said motor configured to accelerate the flywheel assembly to a normal operating speed of at least 6000 rpm; and
   a bearing cooling system effective to cool the one or more bearings at the acceleration rate;
   wherein the gyroscopic roll stabilizer is configured to lock the flywheel assembly at the start of acceleration and to unlock the flywheel assembly when the speed of the flywheel assembly reaches 75% of the normal operating speed.

2. The gyroscopic roll stabilizer of claim 1, wherein a time, from the start of the accelerating until the unlocking of the flywheel assembly to allow precession, is less than 30 minutes.

3. The gyroscopic roll stabilizer of claim 1, wherein a time, from the start of the accelerating until the unlocking of the flywheel assembly to allow precession, is less than 20 minutes.

4. The gyroscopic roll stabilizer of claim 1, wherein a time, from the start of the accelerating until the unlocking of the flywheel assembly to allow precession, is less than 10 minutes.

5. A gyroscopic roll stabilizer for a boat, said gyroscopic stabilizer comprising:
   an enclosure mounted to a gimbal for rotation about a gimbal axis and configured to maintain a below-ambient pressure;
   a flywheel assembly including a flywheel and flywheel shaft, said flywheel assembly having a moment of inertia greater than 11.7 kg·m$^2$ (40,000 lbm·in$^2$); the flywheel assembly configured to precess relative to the gimbal axis, when unlocked, in response to roll of the boat;
   one or more bearings for rotatably mounting the flywheel assembly inside the enclosure;
   a motor for rotating the flywheel assembly, said motor configured to accelerate the flywheel assembly at an acceleration rate of at least 2.5 rpm/s to a normal operating speed of at least 6000 rpm; and
   a bearing cooling system effective to cool the one or more bearings at the acceleration rate;

wherein the gyroscopic roll stabilizer is configured to lock the flywheel assembly at the start of acceleration and to unlock the flywheel assembly when the speed of the flywheel assembly reaches 75% of the normal operating speed.

6. The gyroscopic roll stabilizer of claim 5, wherein a time, from the start of the accelerating until the unlocking of the flywheel assembly to allow precession, is less than 30 minutes.

7. The gyroscopic roll stabilizer of claim 5, wherein a time, from the start of the accelerating until the unlocking of the flywheel assembly to allow precession, is less than 20 minutes.

8. The gyroscopic roll stabilizer of claim 5, wherein a time, from the start of the accelerating until the unlocking of the flywheel assembly to allow precession, is less than 10 minutes.

9. A method of cooling bearings supporting a flywheel assembly in a controlled moment gyroscope configured for roll stabilization of a boat, said method comprising:
maintaining a below ambient pressure within a vacuum enclosure surrounding the flywheel assembly, the flywheel assembly including a flywheel shaft and having a moment of inertia of at least 11.7 kg·m² (40,000 lbm·in²);
applying power to the flywheel assembly to accelerate the flywheel assembly at an acceleration rate of at least 2.5 rpm/s;
locking, during the accelerating, the flywheel assembly against precession;
after the locking, unlocking the flywheel assembly to allow precession of the flywheel assembly and dampening roll of the boat via the precession of the flywheel assembly; and
dissipating heat from the bearings supporting the flywheel assembly by transferring heat by conduction through the flywheel shaft to the exterior of the enclosure.

10. The method of claim 9, wherein a time, from the start of the accelerating until the unlocking of the flywheel assembly to allow precession, is less than 30 minutes.

11. The method of claim 9, wherein a time, from the start of the accelerating until the unlocking of the flywheel assembly to allow precession, is less than 20 minutes.

12. The method of claim 9, wherein a time, from the start of the accelerating until the unlocking of the flywheel assembly to allow precession, is less than 10 minutes.

13. A method of cooling bearings supporting a flywheel assembly in a controlled moment gyroscope configured for roll stabilization of a boat, said method comprising:
maintaining a below ambient pressure within a vacuum enclosure surrounding the flywheel assembly, the flywheel assembly including a flywheel shaft and having a moment of inertia of at least 11.7 kg·m² (40,000 lbm·in²);
applying power to the flywheel assembly to accelerate the flywheel assembly to a normal operating speed of at least 6000 rpm;
locking, during the accelerating, the flywheel assembly against precession;
before the flywheel assembly reaches a speed of at least 75% of the normal operating speed, unlocking the flywheel assembly to allow precession of the flywheel assembly and dampening roll of the boat via the precession of the flywheel assembly; and
dissipating heat from the bearings supporting the flywheel assembly by transferring heat by conduction through the flywheel shaft to the exterior of the enclosure.

14. The method of claim 13, wherein a time, from the start of the accelerating until the unlocking of the flywheel assembly to allow precession, is less than 30 minutes.

15. The method of claim 13, wherein a time, from the start of the accelerating until the unlocking of the flywheel assembly to allow precession, is less than 20 minutes.

16. The method of claim 13, wherein a time, from the start of the accelerating until the unlocking of the flywheel assembly to allow precession, is less than 10 minutes.

17. A method of cooling bearings supporting a flywheel assembly in a controlled moment gyroscope configured for roll stabilization of a boat, said method comprising:
maintaining a below ambient pressure within a vacuum enclosure surrounding the flywheel assembly, the flywheel assembly including a flywheel shaft and having a moment of inertia of at least 11.7 kg·m² (40,000 lbm·in²);
applying power to the flywheel assembly to accelerate the flywheel assembly at an acceleration rate of at least 2.5 rpm/s to a normal operating speed of at least 6000 rpm;
locking, during the accelerating, the flywheel assembly against precession;
before the flywheel assembly reaches a speed of at least 75% of the normal operating speed, unlocking the flywheel assembly to allow precession of the flywheel assembly and dampening roll of the boat via the precession of the flywheel assembly; and
dissipating heat from the bearings supporting the flywheel assembly by transferring heat by conduction through the flywheel shaft to the exterior of the enclosure.

18. The method of claim 17, wherein a time, from the start of the accelerating until the unlocking of the flywheel assembly to allow precession, is less than 30 minutes.

19. The method of claim 17, wherein a time, from the start of the accelerating until the unlocking of the flywheel assembly to allow precession, is less than 20 minutes.

20. The method of claim 17, wherein a time, from the start of the accelerating until the unlocking of the flywheel assembly to allow precession, is less than 10 minutes.

* * * * *